(12) United States Patent
Baek et al.

(10) Patent No.: US 11,183,547 B2
(45) Date of Patent: Nov. 23, 2021

(54) DISPLAY DEVICE

(71) Applicant: Samsung Display Co., Ltd., Yongin-si (KR)

(72) Inventors: Gyungmin Baek, Yongin-si (KR); Sangwon Shin, Yongin-si (KR); Hyuneok Shin, Yongin-si (KR); Juhyun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/798,787

(22) Filed: Feb. 24, 2020

(65) Prior Publication Data

US 2021/0013278 A1 Jan. 14, 2021

(30) Foreign Application Priority Data

Jul. 10, 2019 (KR) .......................... 10-2019-0083435

(51) Int. Cl.
*H01L 27/32* (2006.01)
*H01L 51/56* (2006.01)
*H01L 51/52* (2006.01)

(52) U.S. Cl.
CPC ...... *H01L 27/3258* (2013.01); *H01L 27/3262* (2013.01); *H01L 51/5253* (2013.01); *H01L 51/56* (2013.01); *H01L 2227/323* (2013.01)

(58) Field of Classification Search
CPC combination set(s) only.
See application file for complete search history.

(56) References Cited

U.S. PATENT DOCUMENTS

| 9,899,464 | B2 | 2/2018 | Kim et al. |
| 10,367,046 | B2 | 7/2019 | Lee et al. |
| 2016/0233289 | A1* | 8/2016 | Son .......................... H01L 51/52 |
| 2018/0247994 | A1* | 8/2018 | Seo ....................... H01L 27/3276 |
| 2019/0043997 | A1 | 2/2019 | Lee |

FOREIGN PATENT DOCUMENTS

| KR | 100713878 B1 | 4/2007 |
| KR | 10-0730177 B1 | 6/2007 |
| KR | 1020180047589 A | 5/2018 |
| KR | 1020190014991 A | 2/2019 |

* cited by examiner

*Primary Examiner* — Ratisha Mehta
(74) *Attorney, Agent, or Firm* — Cantor Colburn LLP

(57) ABSTRACT

A display device includes a substrate defining a concave portion recessed from a top surface of the substrate, a lower conductive layer in the concave portion, an upper conductive layer connected to the lower conductive layer, an insulating layer between the lower conductive layer and the upper conductive layer and in which a contact hole is defined, the upper conductive layer connected to the lower conductive layer at the contact hole, a thin-film transistor including a semiconductor layer and a gate electrode on the semiconductor layer, and a display element connected to the thin-film transistor.

20 Claims, 9 Drawing Sheets

DISPLAY DEVICE

This application claims priority to Korean Patent Application No. 10-2019-0083435, filed on Jul. 10, 2019, and all the benefits accruing therefrom under 35 U.S.C. § 119, the disclosure of which is incorporated herein in its entirety by reference.

BACKGROUND

1. Field

One or more embodiments relate to a device, and more particularly, to a display device.

2. Description of Related Art

As the information society has been developed, uses of display devices for displaying an image have increased in various forms. The field of display devices has changed rapidly into flat panel display devices ("FPDs") that replace cathode ray tubes ("CRTs"). The FPDs have relatively large volumes and are relatively thin, light and capable of having relatively large display areas. Examples of FPDs include liquid crystal displays ("LCDs"), plasma display panels ("PDPs"), organic light-emitting display devices, and electrophoretic display devices ("EDs").

These display devices such as FPDs include thin-film transistors ("TFTs"). The TFTs may be formed using a process of manufacturing low temperature polysilicon ("LTPS").

SUMMARY

One or more embodiments include a display device having high reliability. However, the objective is just an example, and the scope of the present disclosure is not limited thereby, and other unmentioned objectives will be clearly understood by those skilled in the art from the description of the present disclosure.

According to one or more embodiments, a display device includes a substrate defining a concave portion recessed from a top surface of the substrate, a lower conductive layer in the concave portion, an upper conductive layer connected to the lower conductive layer, an insulating layer between the lower conductive layer and the upper conductive layer and in which a contact hole is defined, the upper conductive layer connected to the lower conductive layer at the contact hole, a thin-film transistor including a semiconductor layer and a gate electrode on the semiconductor layer, and a display element connected to the thin-film transistor.

The insulating layer may include an interlayer insulating layer between the upper conductive layer and the gate electrode, and in which the contact hole is defined.

The display device may further include an intermediate conductive layer between the upper conductive layer and the lower conductive layer, and the lower conductive layer and the intermediate conductive layer may be connected to each other, and the intermediate conductive layer and the upper conductive layer may be connected to each other.

The insulating layer may include a gate insulating layer between the interlayer insulating layer and the gate electrode, and in which a first contact hole portion is defined, the interlayer insulating layer may define a second contact hole portion, the lower conductive layer and the intermediate conductive layer may be connected to each other via the first contact hole portion, and the upper conductive layer and the intermediate conductive layer may be connected to each other via the second contact hole portion.

The upper conductive layer may be provided as a one body with the gate electrode.

The lower conductive layer may correspond to the thin-film transistor.

The upper conductive layer may be directly connected to the lower conductive layer.

The substrate may include a base layer including polymer resin, and a barrier layer including an inorganic material, the barrier layer being closer to the thin-film transistor than the base layer.

A top surface of the barrier layer may define the top surface of the substrate, the concave portion may be recessed from the top surface of the barrier layer in a direction toward the base layer, and a bottom of the concave portion may correspond to a top surface of the base layer.

A top surface of the barrier layer may define the top surface of the substrate, and the concave portion may include an opening extended from the top surface of the barrier layer and defined through a thickness of the barrier layer, and a recess extended from a top surface of the base layer and connected to the opening.

The top surface of the substrate may be coplanar with a top surface of the lower conductive layer.

The substrate may include glass.

According to one or more embodiments, a display device includes a substrate defining a concave portion recessed from a top surface of the substrate, a lower conductive layer in the concave portion, an insulating layer on the substrate and in which a contact hole is defined corresponding to the lower conductive layer, a thin-film transistor on the substrate and connected to the lower conductive layer, and a display element connected to the thin-film transistor, where the thin-film transistor may include a semiconductor layer and a gate electrode on the semiconductor layer.

The display device may further include an upper conductive layer connected to the thin-film transistor. The insulating layer may include an interlayer insulating layer between the interlayer insulating layer and the gate electrode, and in which the contact hole is defined, and at the contact hole, the upper conductive layer connected to the thin-film transistor may be further connected to the lower conductive layer.

The display device may further include an intermediate conductive layer between the upper conductive layer and the lower conductive layer, and the lower conductive layer may be connected to the intermediate conductive layer, and the intermediate conductive layer may be connected to the upper conductive layer.

At the contact hole, the lower conductive layer may be connected to the thin-film transistor at the gate electrode thereof.

The lower conductive layer may correspond to the thin-film transistor.

The substrate may include a base layer including polymer resin, and a barrier layer including an inorganic material and defining the top surface of the substrate from which the concave portion is recessed.

The substrate may include a base layer including polymer resin, and a barrier layer comprising an inorganic material, a top surface of the barrier layer defining the top surface of the substrate, and the concave portion may include an opening extended from the top surface of the barrier layer and defined through a thickness of the barrier layer, and a recess extended from a top surface of the base layer and connected to the opening.

The top surface of the substrate may be coplanar with a top surface of the lower conductive layer.

BRIEF DESCRIPTION OF THE DRAWINGS

The above and other features, and advantages of certain embodiments of the disclosure will be more apparent from the following description taken in conjunction with the accompanying drawings, in which.

DETAILED DESCRIPTION

Figure 1:
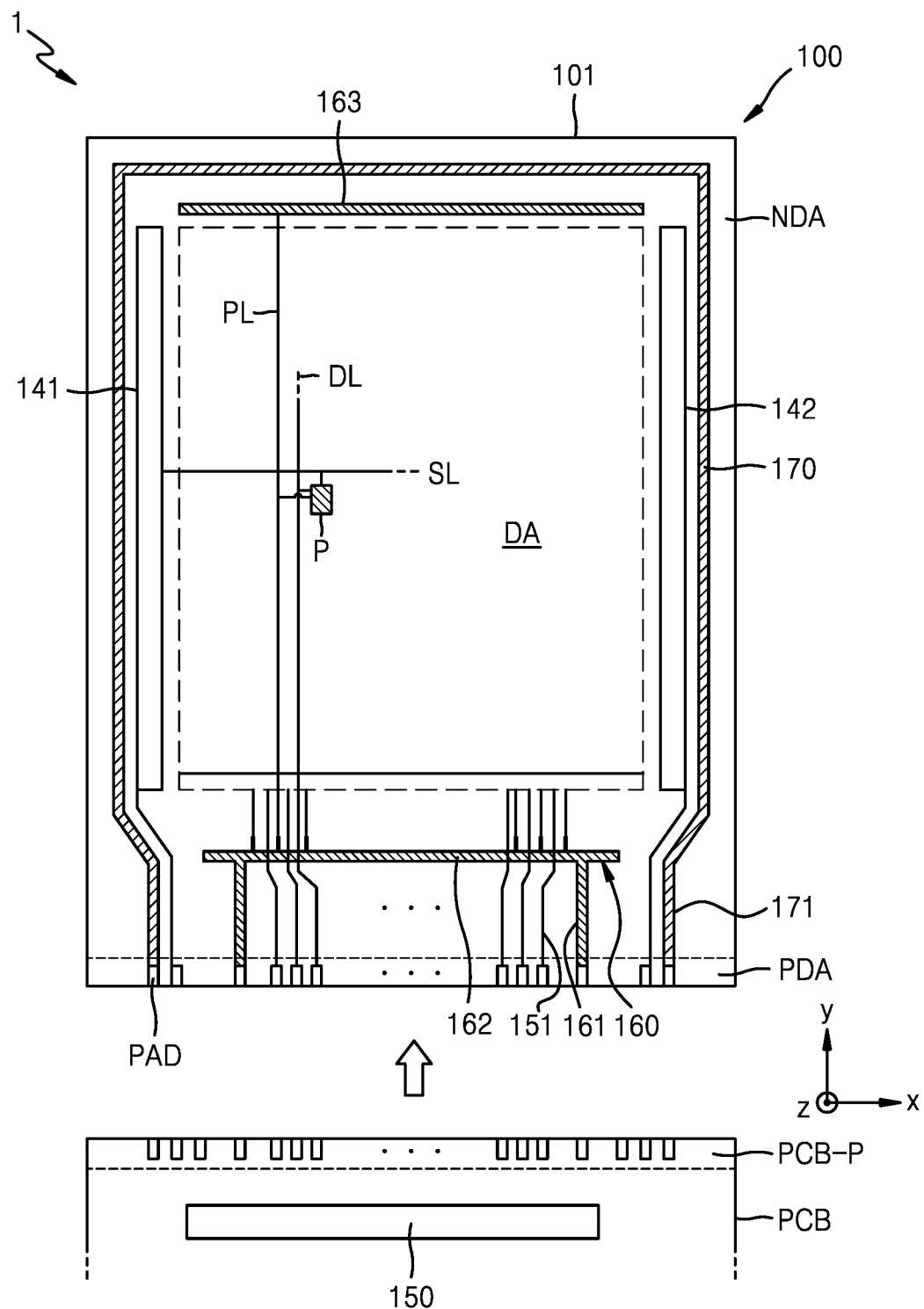
FIG. 1 is a top plan view schematically illustrating an embodiment of a display device.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain features of the present description.

Hereinafter, embodiments of the present disclosure will be described below in more detail with reference to the accompanying drawings. Those components that are the same or are in correspondence are rendered the same reference numeral regardless of the figure number, and a redundant description therewith is omitted.

It will be understood that although the terms "first," "second," etc. may be used herein to describe various components, these components should not be limited by these terms. These components are only used to distinguish one component from another.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being related to another element such as being "on" or "connected to," another layer, region, or component, it may be directly or indirectly on or connected to the other layer, region, or component. That is, for example, intervening layers, regions, or components may be present. For example, it will be understood that when a layer, region, or component is referred to as being "electrically connected to," another layer, region, or component, it may be directly or indirectly electrically connected to the other layer, region, or component. That is, for example, intervening layers, regions, or components may be present. In contrast, when a layer, region, or component is referred to as being related to another element such as being "directly on" or "directly connected to," another layer, region, or component, no intervening layers, regions, or components are present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a top plan view schematically illustrating an embodiment of a display device.

Referring to FIG. 1, a display device 1 includes a display area DA in which an image is realized and a non-display area NDA in which no image is realized. The non-display area NDA is adjacent to the display area DA. The display device 1 may provide an image using light emitted from a pixel P provided in plurality (e.g., a plurality of pixels P) in the display area DA. Each of the plurality of pixels P may emit red, green, blue, or white light.

The display device 1 which is a device for displaying an image, may include a portable mobile device, such as a gaming device, a multimedia device, or a relatively small personal computer ("PC"). Examples of the display device 1 which will be described below may include liquid crystal display ("LCD") devices, electrophoretic display ("ED") devices, organic light-emitting display devices, inorganic electroluminescence ("EL") light-emitting display devices, field emission display ("FED") devices, surface conduction electron-emitter display devices, quantum dot display devices, plasma display devices, and cathode ray tube ("CRT") devices. Hereinafter, an organic light-emitting display device is used as the display device 1 according to an embodiment. However, a display device 1 according to an embodiment is not limited thereto. In another embodiment, a variety of types of display devices described above may be used.

Each of the pixels P may be electrically connected to an outer circuit among outer circuits in the non-display area NDA. A first scan driving circuit 141, a second scan driving circuit 142, a pad unit PDA (or pad area PDA), a data driving circuit 150, a first power supply line 160, and a second power supply line 170 may be in the non-display area NDA as an outer circuit.

The first scan driving circuit 141 may provide a scan signal Sn to each of the pixels P via one or more of a signal line such as a scan line SL. The second scan driving circuit 142 may be disposed in parallel to the first scan driving circuit 141 with the display area DA between the second scan driving circuit 142 and the first scan driving circuit 141. A first portion of the pixels P in the display area DA may be electrically connected to the first scan driving circuit 141 via one or more signal line, and a second portion of the pixels P different from the first portion in the display area DA may be electrically connected to the second scan driving circuit 142 via one or more signal line. In another embodiment, the second scan driving circuit 142 may be omitted.

The pad unit PDA may be positioned at one side of a substrate 101 of the display device 1. In an embodiment, the substrate 101 may represent a planar area of a display panel 100 of the display device 1, without being limited thereto. The display panel 100 may generate an image by using light passing therethrough, may generate and/or emit light for displaying an image, etc., without being limited thereto. A pad PAD provided in plurality (e.g., plurality of pads PAD) may be disposed in the pad unit PDA. Each of pads PAD of the pad unit PDA may not be covered by an insulating layer but may be exposed to outside the insulating layer and electrically connected to a printed circuit board PCB external to the substrate 101 or the display panel 100.

A terminal unit PCB-P (or terminal area PCB-P) of the printed circuit board PCB may be electrically connected to the pad unit PDA of the display panel 100. In an embodiment, terminals of the terminal unit PCB-P may be variously connected to the pads PAD of the pad unit PDA. That is, the display panel 100 and the printed circuit board PCB may be connected to each other at the pads PAD and the terminals, respectively.

The printed circuit board PCB disposed outside of the display panel 100 transmits a signal or power of a controller (not shown) to the display panel 100 from outside thereof. A control signal generated by the controller may be transmitted to each of the first and second scan driving circuits 141 and 142 via the printed circuit board PCB. The controller may provide a first power supply voltage ELVDD (FIG. 2) and a second power supply voltage ELVSS (FIG. 2) to each of the first and second power supply lines 160 and 170 via first and second connection wires 161 and 171. The first power supply voltage ELVDD may be provided to each of the pixels P via a driving voltage line PL connected to the first power supply line 160, and the second power supply voltage ELVSS may be provided to each of the pixels P connected to the second power supply line 170.

The data driving circuit 150 is electrically connected to the display area DA via one or more of a signal line such as a data line DL. A data signal Dm of the data driving circuit 150 may be provided to each of the pixels P via a connection wire 151 connected between the pad unit PDA and the data line DL. FIG. 1 illustrates the data driving circuit 150 on the printed circuit board PCB. However, in another embodiment, the data driving circuit 150 may be on the substrate 101. In an embodiment, for example, the data driving circuit 150 may be between the pad unit PDA and the first power supply line 160.

The first power supply line 160 may include a first sub-line 162 and a second sub-line 163, which extend in parallel to each other along an x-direction, with the display area DA between the first sub-line 162 and the second sub-line 163 along the y-direction. The second power supply line 170 may have a loop shape with one open side at the pad unit PDA and may partially surround the display area DA.

A thickness of the display device 1, the display panel 100, the printed circuit board PCB and/or various elements of aforementioned components, is defined along a z-direction which crosses each of the x-direction and the y-direction. The two directions of the x-direction and the y-direction may define a plane in which the display device 1, the display panel 100, the printed circuit board PCB and/or various elements of aforementioned components is disposed.

Figure 2:
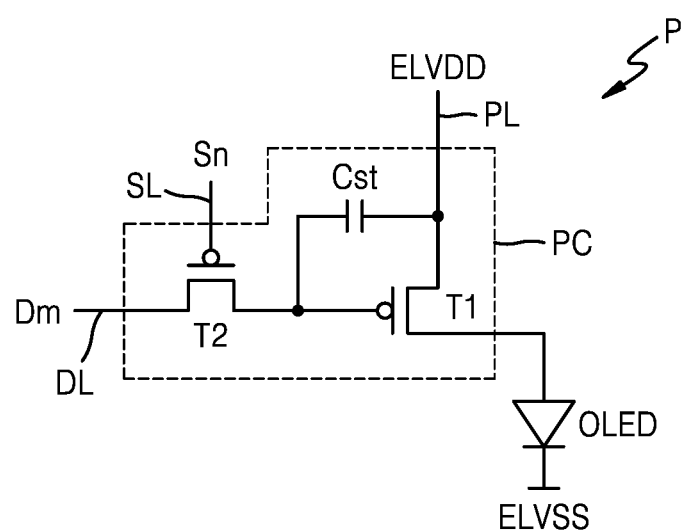
FIG. 2 is an equivalent circuit diagram of an embodiment of a pixel included in a display device.

FIG. 2 is an equivalent circuit diagram of an embodiment of one pixel P included in a display device 1.

Referring to FIG. 2, each of the pixels P may include a pixel circuit PC and an organic light-emitting diode OLED as a display element which is connected to the pixel circuit PC. The pixel circuit PC may control and/or drive the display element to display an image, generate light, emit light, etc., without being limited thereto.

The pixel circuit PC may include a first thin-film transistor T1, a second thin-film transistor T2, and a storage capacitor Cst. Each of the pixels P may emit, for example, red, green or blue light, or red, green, blue or white light via the organic light-emitting diode OLED.

The second thin-film transistor T2 which is a switching thin-film transistor may be connected to the scan line SL and the data line DL and may transmit a data voltage input from the data line DL to the first thin-film transistor T1 based on a switching voltage input from the scan line SL. The storage capacitor Cst may be connected to the second thin-film transistor T2 and the driving voltage line PL and may store a voltage which corresponds to a difference between a voltage transmitted from the second thin-film transistor T2 and the first power supply voltage ELVDD supplied to the driving voltage line PL.

The first thin-film transistor T1 which is a driving thin-film transistor may be connected to the driving voltage line PL and the storage capacitor Cst and may control an electrical driving current which flows through the organic light-emitting diode OLED from the driving voltage line PL in correspondence with a voltage value stored in the storage capacitor Cst. The organic light-emitting diode OLED may emit light having certain brightness according to the electrical driving current. A common electrode (for example, a cathode) of the organic light-emitting diode OLED may receive the second power supply voltage ELVSS.

FIG. 2 illustrates that the pixel circuit PC includes two thin-film transistors T1 and T2 and one storage capacitor Cst. However, embodiments are not limited thereto. The number of thin-film transistors T1 and T2 and the number of storage capacitors Cst may be variously modified according to the design of the pixel circuit PC. In an embodiment, for example, the pixel circuit PC may further include one or more thin-film transistors except for the two thin-film transistors T1 and T2 described above.

Figure 3A:
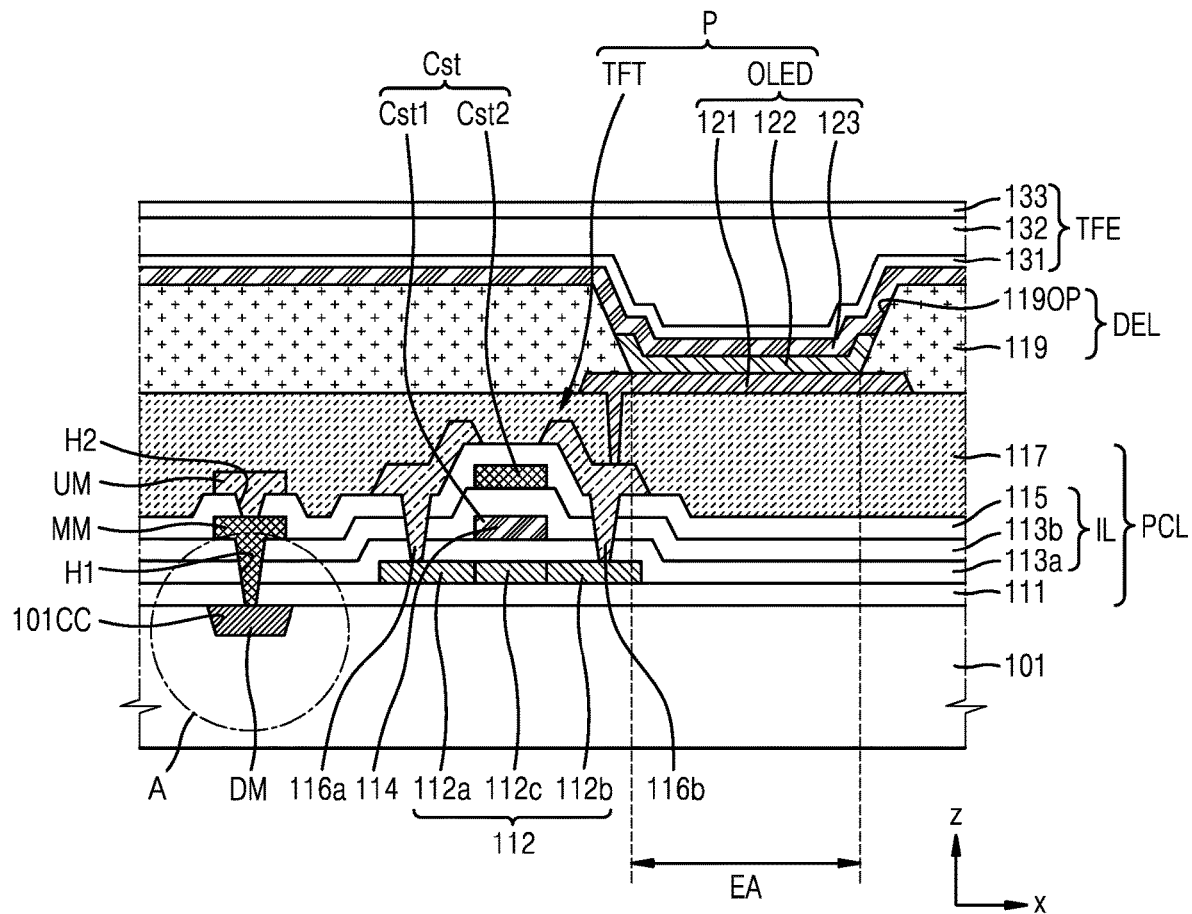
FIG. 3A is an enlarged cross-sectional view of an embodiment of a pixel of a display device.
Figure 3B:
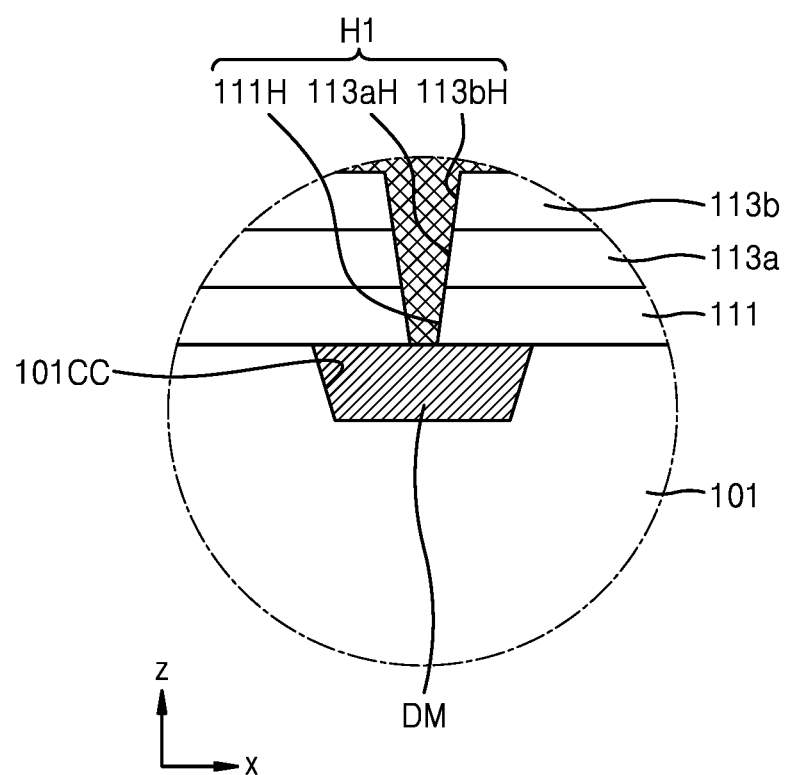
FIG. 3B is an enlarged view of region A of FIG. 3A.

FIG. 3A is an enlarged cross-sectional view of an embodiment of a pixel P of a display device 1. FIG. 3B is an enlarged view of region A of FIG. 3A.

A pixel circuit layer PCL including a pixel circuit PC and insulating layers may be on the substrate 101, and a display element layer DEL including a plurality of display elements may be on the pixel circuit layer PCL. The display element layer DEL may include display elements, for example, the organic light-emitting diode OLED described above. The pixel circuit layer PCL may include the pixel circuit PC connected to each of organic light-emitting diodes OLED and the insulating layers. The pixel circuit layer PCL may include a plurality of transistors and storage capacitors, and insulating layers therebetween.

Referring to FIGS. 3A and 3B, the substrate 101 may include a concave portion 101CC (or a recess 101CC), and a lower conductive layer DM (e.g., lower conductive layer pattern DM) may be in the concave portion 101CC. The concave portion 101CC in which the lower conductive layer DM is disposed, is defined at an upper surface of the substrate 101 by portions thereof. In an embodiment, the substrate 101 may define the concave portion 101CC, such as by portions of the upper surface of the substrate 101 defining the concave portion 101CC.

In an embodiment, the substrate 101 may include glass. In another embodiment, the substrate 101 may include polymer resin.

The substrate 101 may include the concave portion 101CC. In detail, the concave portion 101CC may be recessed from a top surface of the substrate 101 to be open toward the pixel circuit layer PCL, along the z-direction. That is, the concave portion 101CC is open to outside the substrate 101. FIGS. 3A and 3B illustrate the concave portion 101CC having a trapezoidal cross-section. However, in another embodiment, the concave portion 101CC may have various shapes in cross-section. In an embodiment, for example, the cross-sectional shape of the concave portion 101CC may include a polygon, such as a rectangle or square, and a semicircle.

A width of the concave portion 101CC is taken along the x-direction and/or the y-direction, and may be modified in various ways. In an embodiment, for example, the concave portion 101CC may define a length which extends in a lengthwise direction of the substrate 101 (e.g., along the x-direction and/or the y-direction) and may overlap a thin-film transistor TFT. In another embodiment, the concave portion 101CC may define the length thereof which extends in the lengthwise direction of the substrate 101 and may be adjacent to the thin-film transistor TFT. In another embodiment, the concave portion 101CC may not overlap or correspond to the thin-film transistor TFT (e.g., be spaced apart therefrom along the x-direction and/or the y-direction). Referring to FIG. 3A, for example, a width of the concave portion 101CC is defined along the x-direction while a length thereof is defined along the y-direction crossing the x-direction.

A depth of the concave portion 101CC is taken along the z-direction and may be less than a thickness of the substrate 101 taken along the z-direction. The depth of the concave portion 101CC may be variously modified. The concave portion 101CC may be provided or formed to a larger or smaller depth than the depth shown in FIG. 3A. That is, in one or more embodiment, the depth of the concave portion 101CC is less than the thickness of the substrate 101 such that a portion of the substrate 101 remains under the concave portion 101CC.

The position of the concave portion 101CC may be variously modified. In an embodiment, for example, the concave portion 101CC may be adjacent to the thin-film transistor TFT. In another embodiment, the concave portion 101CC may not be adjacent to the thin-film transistor TFT.

The lower conductive layer DM may be in the concave portion 101CC. In detail, the lower conductive layer DM may be in the concave portion 101CC and may fill the concave portion 101CC. In an embodiment, a top surface of the lower conductive layer DM may be in a same plane as a top surface of the substrate 101 (e.g., be coplanar with each other). In detail, the top surface of the substrate 101, in which the concave portion 101CC is not positioned, may be on the same plane as the top surface of the lower conductive layer DM. The top surfaces described above may be those surfaces which are closest to the pixel circuit layer PCL along the z-direction.

The lower conductive layer DM may include a conductive material such as titanium (Ti), copper (Cu), aluminum (Al), silver (Ag), tungsten (W), tantalum (Ta), and niobium (Nb).

The concave portion 101CC and the lower conductive layer DM may be provided or formed at the top surface of the substrate 101 described above by using the following manufacturing method.

A substrate 101 is prepared. A photoresist pattern is provided or formed on the substrate 101 except for a portion where the concave portion 101CC is to be formed (e.g., except for a position corresponding to the concave portion 101CC).

The concave portion 101CC may be provided formed in the substrate 101, such as by using an etching process. The etching process may be performed by wet etching, dry etching, or a combination thereof. The providing the concave portion 101CC may define a recess extended from a top surface of the substrate 101 and along the z-direction, to a depth less than a thickness of the substrate 101. That is, a portion of the substrate 101 corresponding to a cross-section of the concave portion 101CC may be removed from the substrate 101, to form the concave portion 101CC as a recess in the substrate 101.

The photoresist pattern is removed from the substrate 101 having the concave portion 101CC defined therein. A well-known method for removing the photoresist pattern may be used.

A metallic material is deposited on the substrate 101 having the concave portion 101CC defined therein. In an embodiment, a metallic material layer of the metallic material may be disposed on an entirety of the substrate 101 having the concave portion 101CC defined therein, without being limited thereto. The metallic material may be disposed in the concave portion 101CC.

A lower conductive layer DM is provided or formed, such as by performing a chemical mechanical polishing ("CMP") process on the substrate 101 having the metallic material in the concave portion 101CC.

Since the metallic material for providing the lower conductive layer DM undergoes the CMP process, the lower conductive layer DM may be provided or formed from the metallic material to be disposed only in the concave portion 101CC. The lower conductive layer DM may be provided or formed as a metallic material pattern or conductive pattern embedded in the substrate 101. Also, the top surface of the lower conductive layer DM may be in the same plane as (e.g., coplanar with) the top surface of the substrate 101 from which the concave portion 101CC is recessed.

The pixel circuit layer PCL may include a buffer layer 111, a thin-film transistor TFT, an inorganic insulating layer IL, and a planarization insulating layer 117. The inorganic insulating layer IL may include a first gate insulating layer 113a, a second gate insulating layer 113b, and an interlayer insulating layer 115.

The buffer layer 111 may include an inorganic insulating material, such as silicon nitride, silicon oxynitride, and silicon oxide, and may have a single layer or multi-layer structure including one or more of the inorganic insulating material described above.

The thin-film transistor TFT may include a semiconductor layer 112. The semiconductor layer 112 may include polysilicon. Alternatively, the semiconductor layer 112 may include amorphous silicon, an oxide semiconductor, or an organic semiconductor. The semiconductor layer 112 may include a channel area 112c, and a drain area 112a and a source area 112b which are at opposing sides of the channel area 112c. A gate electrode 114 of the thin-film transistor TFT may overlap the channel area 112c.

The amorphous silicon of the semiconductor layer 112 may include polysilicon provide or formed, such as by using an excimer laser annealing ("ELA") process.

The gate electrode 114 may include a relatively low electrical resistance metallic material. The gate electrode 114 may include a conductive material such as molybdenum (Mo), aluminum (Al), copper (Cu), and titanium (Ti) and may have a multi-layer or single layer structure including one or more of the relatively low electrical resistance metallic materials described above.

A first gate insulating layer 113a between the semiconductor layer 112 and the gate electrode 114 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The second gate insulating layer 113b may be provided to cover the gate electrode 114. Similarly to the first gate insulating layer 113a, the second gate insulating layer 113b may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

An upper electrode Cst2 of the storage capacitor Cst may be on the second gate insulating layer 113b. The upper electrode Cst2 may overlap the gate electrode 114 thereunder. In this case, the gate electrode 114 and the upper electrode Cst2 which overlap each other with the second gate insulating layer 113b between the gate electrode 114 and the upper electrode Cst2 may constitute the storage capacitor Cst. That is, the gate electrode 114 may function as a lower electrode Cst1 of the storage capacitor Cst.

Referring to FIG. 3A, the storage capacitor Cst and the thin-film transistor TFT overlap each other, particularly due to the gate electrode 114 being common to both the thin-film transistor TFT and the storage capacitor Cst. In another embodiment, the lower electrode Cst1 of the storage capacitor Cst may be a separate element from the gate electrode 114, and thus, the storage capacitor Cst may not overlap the thin-film transistor TFT. In an embodiment, the lower electrode Cst1 of the storage capacitor Cst which is spaced apart from the gate electrode 114 disposes the storage capacitor Cst non-overlapping the thin-film transistor TFT.

The upper electrode Cst2 may include Al, platinum (Pt), palladium (Pd), silver (Ag), magnesium (Mg), gold (Au), nickel (Ni), neodymium (Nd), iridium (Ir), chromium (Cr), nickel (Ni), calcium (Ca), Mo, Ti, W, and/or Cu and may have a single layer or multi-layer structure of the materials described above.

The interlayer insulating layer 115 may cover the upper electrode Cst2. The interlayer insulating layer 115 may include an inorganic material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 115 may have a single layer or multi-layer structure including the inorganic materials described above.

Each of a drain electrode 116a and a source electrode 116b of the thin-film transistor TFT may be on the interlayer insulating layer 115. The drain electrode 116a and the source electrode 116b may include a material having relatively high conductivity. The drain electrode 116a and the source electrode 116b may include conductive materials including Mo, Al, Cu, and Ti and may have a multi-layer or single layer structure including the materials described above. In an embodiment, the drain electrode 116a and the source electrode 116b may have a multi-layer structure of Ti/Al/Ti.

Referring to FIG. 3B, each of the buffer layer 111, the first gate insulating layer 113a, the second gate insulating layer 113b, and the interlayer insulating layer 115 may include a contact hole defined therein. In detail, the buffer layer 111 may include a buffer layer contact hole 111H. The first gate insulating layer 113a may include a first gate insulating layer contact hole 113aH, and the second gate insulating layer 113b may include a second gate insulating layer contact hole 113bH. The interlayer insulating layer 115 may include a second contact hole H2 (e.g., second contact hole portion H2).

The buffer layer contact hole 111H, the first gate insulating layer contact hole 113aH, and the second gate insulating layer contact hole 113bH may be connected to one another. The buffer layer contact hole 111H, the first gate insulating layer contact hole 113aH, and the second gate insulating layer contact hole 113bH may together define a first contact hole H1 (e.g., first contact hole portion H1). The first contact hole H1 and the second contact hole H2 may together define portions of a same single one contact hole.

The lower conductive layer DM may correspond to the first contact hole H1. Alternatively, the concave portion 101CC of the substrate 101 may correspond to the first contact hole H1.

An intermediate conductive layer MM may be on the second gate insulating layer 113b so as to correspond to the first contact hole H1. A first portion of the intermediate conductive layer MM is between the second gate insulating layer 113b and the interlayer insulating layer 115, and the intermediate conductive layer MM extends to define a second portion thereof in the first contact hole H1. Thus, the intermediate conductive layer MM may be connected to the lower conductive layer DM at or via the first contact hole H1. In an embodiment, the intermediate conductive layer MM may be in a same layer as the upper electrode Cst2 of the storage capacitor Cst. As being "in a same layer," elements are respective portions of a same material layer provided on the substrate 101. In an embodiment, elements "in a same layer" are provided or formed from a same material layer disposed on the substrate 101 in a method of manufacturing the display device 1.

Referring to FIGS. 3A and 3B, an intermediate conductive layer MM may include a conductive material such as Mo, Al, Cu, and Ti and may have a multi-layer or single layer structure including the materials described above.

An upper conductive layer UM may be on the interlayer insulating layer 115 so as to correspond to the second contact hole H2. In an embodiment, the upper conductive layer UM may be in a same layer as the drain electrode 116a or the source electrode 116b. In an embodiment, the upper conductive layer UM may function as a driving voltage line PL (see FIGS. 1 and 2). Thus, although not shown, the upper conductive layer UM may be connected to the thin-film transistor TFT.

The lower conductive layer DM may be connected to the intermediate conductive layer MM, and the intermediate conductive layer MM may be connected to the upper conductive layer UM. Thus, the lower conductive layer DM may be connected to the upper conductive layer UM.

The upper conductive layer UM may include a conductive material such as Al, Cu, and Ti and may have a multi-layer or single layer structure including one or more of the materials described above.

The planarization insulating layer 117 may include an organic insulating layer. The planarization insulating layer 117 may include a polymer such as polymethylmethacrylate ("PMMA") or polystyrene ("PS"), a polymer derivative having one or more among a phenol-based group, acryl-based polymer, imide-based polymer, aryl ether-based polymer, amide-based polymer, fluorine-based polymer, p-xylene-based polymer, vinyl alcohol-based polymer, and a combination thereof.

The display element layer DEL may be on the pixel circuit layer PCL having the above-described structure. The display element layer DEL may include an organic light-emitting diode OLED. Here, a pixel electrode 121 of the organic light-emitting diode OLED may be electrically connected to the thin-film transistor TFT via a contact hole of the planarization insulating layer 117.

The pixel electrode 121 may include conductive oxide, such as indium tin oxide ("ITO"), indium zinc oxide ("IZO"), zinc oxide ("ZnO"), indium oxide ($In_2O_3$), indium gallium oxide ("IGO"), or aluminum zinc oxide ("AZO"). In another embodiment, the pixel electrode 121 may include a reflective layer including silver (Ag), magnesium (Mg), Al, Pt, Pd, Au, Ni, Nd, Ir, Cr, or a combination thereof. In another embodiment, the pixel electrode 121 may further include a layer including or formed of ITO, IZO, ZnO, or $In_2O_3$ on/under the reflective layer described above.

A pixel-defining layer 119 having an opening 119OP defined therein exposing the pixel electrode 121, is on the pixel electrode 121. A center of the pixel electrode 121 may be exposed outside the pixel-defining layer 119 at the opening 119OP thereof, without being limited thereto. The pixel-defining layer 119 may include an organic insulating material and/or an inorganic insulating material. The opening 119OP may define an emission area of light as an area of the pixel P at which light from the organic light-emitting diode OLED is emitted (hereinafter, referred to as an emission area EA or light emission area EA). In an embodiment, for example, a width of the opening 119OP may correspond to a width of the emission area EA, where the respective widths are defined along the x-direction and/or the y-direction.

An emission layer 122 of the organic light-emitting diode OLED may be in the opening 119OP of the pixel-defining layer 119. The emission layer 122 may include a polymer or relatively small molecular weight organic material with which a light of a certain color is generated and/or emitted. Although not shown, a first functional layer and a second functional layer of the organic light-emitting diode OLED may be under and above the emission layer 122, respectively. The first functional layer may include, for example, a hole transport layer ("HTL"), or an HTL and a hole injection layer ("HIL"). The second functional layer which is an element disposed on the emission layer 122 is optional. The second functional layer may include an electron transport layer ("ETL") and/or an electron injection layer ("EIL"). The first functional layer and/or the second functional layer may be provided as a common layer provided or formed to cover the substrate 101 entirely, like a common electrode 123 of the organic light-emitting diode OLED which will be described below.

The common electrode 123 may include a conductive material having a relatively small work function. In an embodiment, for example, the common electrode 123 may include a (semi-)transparent layer including one or more among Ag, Mg, Al, Pt, Pd, Au, Ni, Nd, Ir, Cr, lithium (Li), calcium (Ca), or an alloy thereof. Alternatively, the common electrode 123 may further include a layer, such as ITO, IZO, ZnO, or $In_2O_3$, on the (semi-)transparent layer including the material described above.

A thin-film encapsulation layer TFE may include at least one inorganic encapsulation layer and at least one organic encapsulation layer. In an embodiment, FIG. 3A illustrates that the thin-film encapsulation layer TFE includes a first inorganic encapsulation layer 131, an organic encapsulation layer 132, and a second inorganic encapsulation layer 133, which are sequentially stacked.

The first inorganic encapsulation layer 131 and the second inorganic encapsulation layer 133 may include at least one inorganic material among aluminum oxide, titanium oxide, tantalum oxide, hafnium oxide, zinc oxide, silicon oxide, silicon nitride, and silicon oxynitride. The organic encapsulation layer 132 may include a polymer-based material. The polymer-based material may include an acryl-based resin, an epoxy-based resin, polyimide, and polyethylene. In an embodiment, the organic encapsulation layer 132 may include acrylate.

A touch electrode layer (not shown) of the display device 1 or the display panel 100 may be disposed on the thin-film encapsulation layer TFE, and an optical functional layer (not shown) of the display device 1 or the display panel 100 may be disposed on the touch electrode layer. The touch electrode layer may attain coordinate information according to an external input to the display device 1 or the display panel 100, for example, a touch event.

The optical functional layer may reduce the reflectivity of light (external light) which is incident onto the display device 1 and/or the display panel 100 from outside thereof and/or may improve color purity of light emitted from the display device 1 and/or the display panel 100. In an embodiment, the optical functional layer may include a retarder and a polarizer. The retarder may be of a film type or liquid crystal coating type and may include a λ/2 retarder and/or λ/4 retarder. The polarizer may be also of a film type or liquid crystal coating type. A film type polarizer may include an elongation-type synthetic resin film, and a liquid crystal coating type polarizer may include liquid crystals in a predetermined arrangement. The retarder and the polarizer may further include a protective film.

In another embodiment, the optical functional layer may include a black matrix and color filters. The color filters may be arranged considering colors of light emitted from each of the pixels P. Each of the color filters may include a red, green, or blue pigment or dye. Alternatively, each of the color filters may further include quantum dots except for the pigment or dye described above. Alternatively, some of the color filters may not include the pigment or dye described above and may include scattering particles, such as titanium oxide.

In another embodiment, the optical functional layer may include a destructive interference structure. The destructive interference structure may include a first reflective layer and a second reflective layer, which are disposed in different layers from each other. First reflected light and second reflected light, which are reflected from the first reflective layer and the second reflective layer, respectively, may destructively interfere, and as such, the reflectivity of external light may be reduced.

The arrangement of the lower conductive layer DM described above may be provided to reduce the electrical resistance of a wire (e.g., a signal wire, conductive wire, power line, etc.). In an embodiment, the arrangement of the lower conductive layer DM described above may be provided to reduce the electrical resistance of a driving voltage line PL. In detail, the upper conductive layer UM which may function as a driving voltage line PL may be connected to the lower conductive layer DM and thus, the electrical resistance of the driving voltage line PL may be reduced. Thus, problems of a residual image which may occur due to relatively high electrical resistance may be solved. Since the upper conductive layer UM connected to the lower conductive layer DM may function as a driving voltage line PL and since the first thin-film transistor T1 may be connected to the driving voltage line PL, it follows that the lower conductive layer DM may be connected via the driving voltage line PL to a thin-film transistor TFT.

Also, the top surface of the lower conductive layer DM may be in the same plane as the top surface of the substrate 101. That is, the coplanar top surfaces of the substrate 101 and the lower conductive layer DM provide a flat surface without a step structure on which other layers of the display panel 100 may be disposed. Thus, even when the lower conductive layer DM is provided or formed connected to the upper conductive layer UM, a pixel circuit layer PCL may be provided or formed on the substrate 101 without any step difference. In particular, the semiconductor layer 112 may be provided or formed without any step difference due to an underlying structure or profile.

In a comparative embodiment, when there is a step difference between or defined by the lower conductive layer DM and the substrate 101, such as due to an energy difference caused by a radiation distance of laser in an ELA process, polysilicon of the semiconductor layer 112 overlying the lower conductive layer DM and the substrate 101 may not uniformly formed. In contrast, when the top surface of the lower conductive layer DM is coplanar with the top surface of the substrate 101 in one or more embodiment, uniform polysilicon of the semiconductor layer 112 may be provided or formed and thus, a variety of display devices having high quality may be manufactured.

Figure 4A:
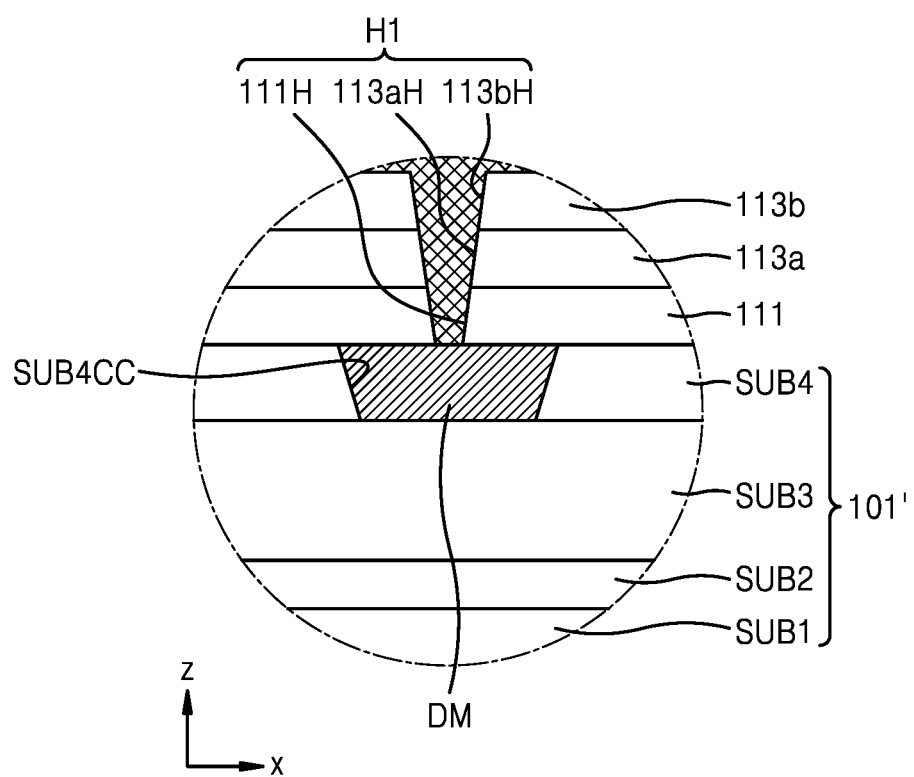
FIG. 4A is an enlarged cross-sectional view of a modified embodiment of a display device.

FIG. 4A is an enlarged cross-sectional view of a modified embodiment of a display device. The view in FIG. 4A may correspond to region A of FIG. 3A.

In FIG. 4A, the same reference numerals as those of FIG. 3B refer to the same elements and thus, a redundant description thereof will be omitted.

Referring to FIG. 4A, a substrate 101' may include a concave portion SUB4CC. A lower conductive layer DM may be in the concave portion SUB4CC. The concave portion SUB4CC of FIG. 4A is similar to the concave portion 101CC relative to the substrate 101 of FIGS. 3A and 3B, and thus, a detailed description thereof will be omitted.

The substrate 101' may be flexible. The substrate 101' may include polymer resin and have a multi-layer structure include both a base layer and a barrier layer. In an embodiment, for example, as shown in FIG. 4A, the substrate 101' may include a first base layer SUB1, a first barrier layer SUB2, a second base layer SUB3, and a second barrier layer SUB4, which are sequentially stacked.

Each of the first base layer SUB1 and the second base layer SUB3 may include polymer resin. In an embodiment, for example, the first base layer SUB1 and the second base layer SUB3 may include polymer resin, such as polyethersulfone, polyarylate, polyetherimide, polyethylene naphthalate, polyethylene terephthalate, polyphenylene sulfide, polyimide, polycarbonate ("PC"), cellulose triacetate ("TAC"), or cellulose acetate propionate.

The first barrier layer SUB2 and the second barrier layer SUB4 which reduce or effectively prevent penetration of external foreign substances, may have a single layer or multi-layer structure including an inorganic material, such as silicon nitride ($SiN_x$) (where x is greater than 0), or silicon oxide ($SiO_x$) (where x is less than 0).

The concave portion SUB4CC may be included or defined in the second barrier layer SUB4. In detail, the concave portion SUB4CC may be recessed from a top surface of the second barrier layer SUB4 which defines a top surface of the substrate 101'. That is, where the top surface of a barrier layer (e.g., second barrier layer SUB4) defines the top surface of the substrate 101', the concave portion SUB4CC is recessed from the top surface of the barrier layer in a direction toward a base layer (e.g., second base layer SUB3), and a bottom of the concave portion SUB4CC corresponds to a top surface of the base layer.

A top surface of the lower conductive layer DM may be coplanar with the top surface of the second barrier layer SUB4. In detail, the top surface of the second barrier layer SUB4 from which the concave portion SUB4CC is recessed may be coplanar with the top surface of the lower conductive layer DM. The top surface of the second barrier layer SUB4 may be adjacent to the top surface of the lower conductive layer DM, so as to be disposed at positions along the substrate 101' at which the concave portion SUB4CC is not disposed.

In FIG. 4A, a bottom of the concave portion SUB4CC is coplanar with a bottom surface of the second barrier layer SUB4. However, in another example, the bottom of the concave portion SUB4CC may be in the second barrier layer SUB4 to be spaced apart (e.g., along the z-direction) from a plane in which the bottom surface of the second barrier layer SUB4 is disposed.

Figure 4B:
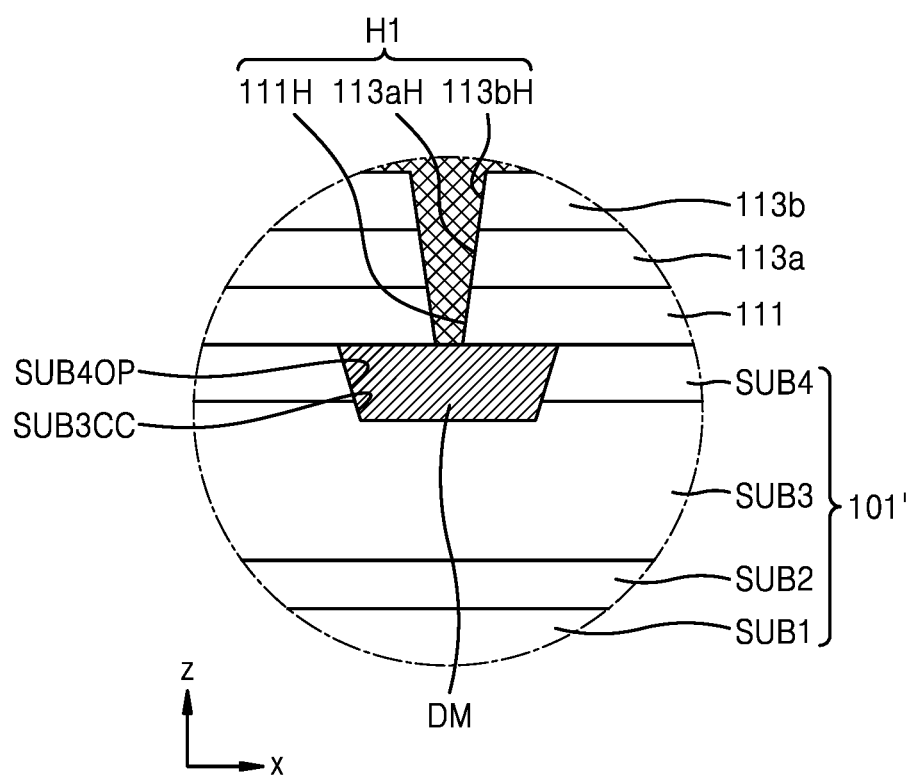
FIG. 4B is an enlarged cross-sectional view of another modified embodiment of a display device.

FIG. 4B is an enlarged cross-sectional view of another modified embodiment of a display device. The view in FIG. 4B may correspond to region A of FIG. 3A.

In FIG. 4B, the same reference numerals as those of FIG. 4A refer to the same elements, and thus, a redundant description thereof will be omitted.

Referring to FIG. 4B, the second barrier layer SUB4 may include a lower opening SUB4OP. The second base layer SUB3 may include a concave portion SUB3CC (e.g., recess SUB3CC). The concave portion SUB3CC of FIG. 4B is similar to the concave portion SUB4CC of FIG. 4A, and thus, a detailed description thereof will be omitted.

The top surface of a barrier layer (e.g., second barrier layer SUB4) defines the top surface of the substrate 101'. The second barrier layer SUB4 may include a lower opening SUB4OP defined therein. The lower opening SUB4OP extends from a top surface of the barrier layer (e.g., second barrier layer SUB4) and completely through a thickness of the second barrier layer SUB4. The second base layer SUB3 may be exposed outside the second barrier layer SUB4 at the lower opening SUB4OP. The lower opening SUB4OP may correspond to the concave portion SUB3CC. A recess (e.g., the concave portion SUB3CC) is extended from a top surface of the base layer (e.g., second base layer SUB3) and is connected to the lower opening SUB4OP. Thus, the lower opening SUB4OP connected to the concave portion SUB3CC may form a single concave portion (e.g., recess) within the substrate 101'.

The lower conductive layer DM may extend to be disposed in each of the lower opening SUB4OP and the concave portion SUB3CC. In other words, a total height of the lower conductive layer DM taken along the z-direction, may be less than a total thickness of the substrate 101'. In embodiments, the lower conductive layer DM has various depths along a thickness of the substrate 101', so long as a maximum height of the lower conductive layer DM is less than the thickness of the substrate 101'.

Figure 5:
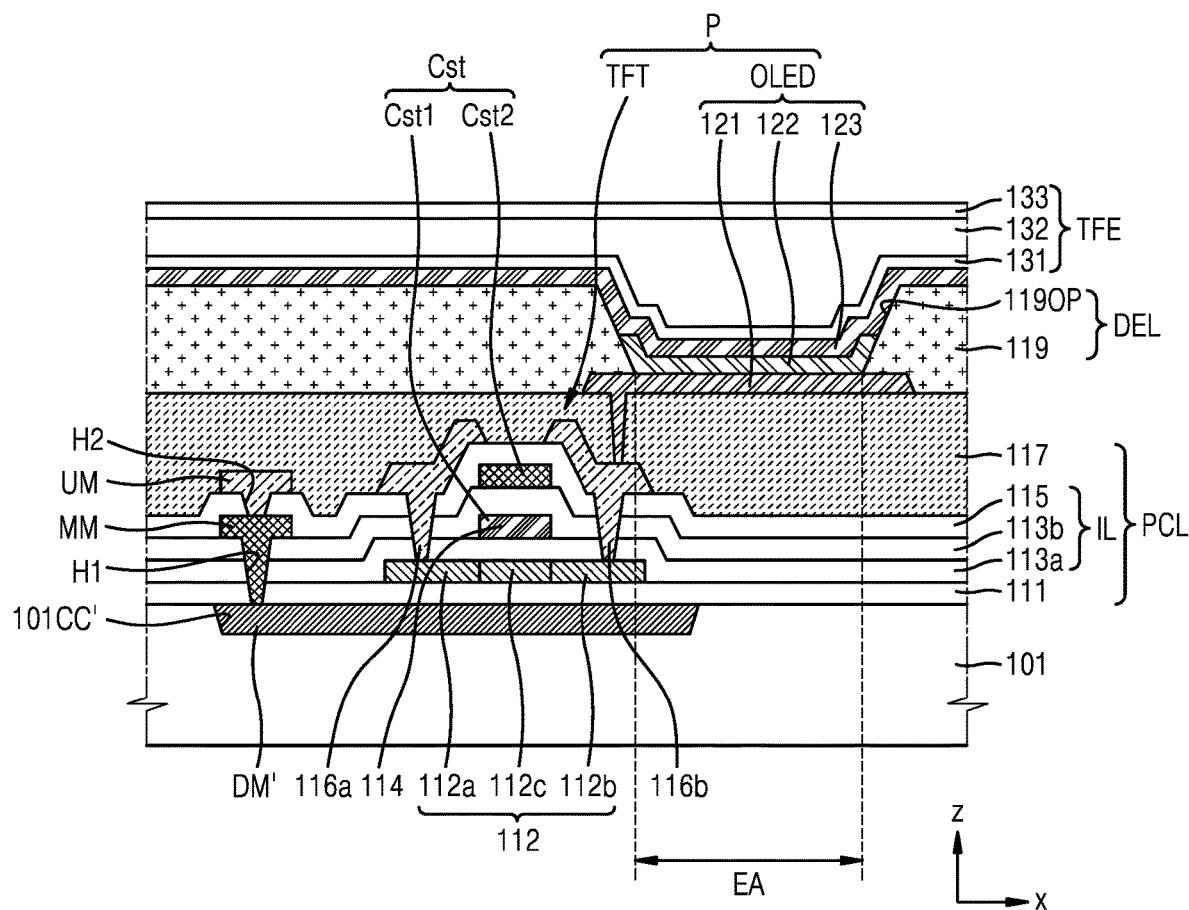
FIG. 5 is an enlarged cross-sectional view of another embodiment of a pixel of a display device.

FIG. 5 is an enlarged cross-sectional view of another embodiment of a pixel P of a display device 1.

In FIG. 5, the same reference numerals as those of FIG. 3A refer to the same elements, and thus, a redundant description thereof will be omitted.

Referring to FIG. 5, a substrate 101 may include a concave portion 101CC', and a lower conductive layer DM' may be in the concave portion 101CC'.

The concave portion 101CC' may overlap the thin-film transistor TFT. In detail, the concave portion 101CC' may extend from a position corresponding to the first contact hole H1 to be arranged below the thin-film transistor TFT and to correspond to the thin-film transistor TFT.

A width of the concave portion 101CC' along one or both directions among the x-direction and the y-direction may be greater than a width of the thin-film transistor TFT along the same one or the both directions among the x-direction and the y-direction. In detail, an entirety of the thin-film transistor TFT may be overlapped by the concave portion 101CC'.

The lower conductive layer DM' may overlap the thin-film transistor TFT. In detail, the lower conductive layer DM' may be arranged in the concave portion 101CC' at a lower portion of the thin-film transistor TFT. Thus, the lower conductive layer DM' may reduce or effectively prevent characteristics of the thin-film transistor TFT from being deteriorated due to light incident from below the substrate 101.

The lower conductive layer DM' may be connected to the upper conductive layer UM via the first contact hole H1 and the second contact hole H2. The lower conductive layer DM' may receive a constant voltage or signal from the upper conductive layer UM. In an embodiment, for example, the lower conductive layer DM' may receive a driving voltage or scan signal Sn. The lower conductive layer DM' may reduce a probability in which electrostatic discharge may occur due to the constant voltage or signal received.

In another embodiment, the lower conductive layer DM' may be applied to a display device 1 having a light-transmitting portion inside the display area DA. Light may transmit through layers of the display device 1 and/or the display panel 100 at the light-transmitting portion, to be emitted from the display device 1 and/or the display panel 100 at the light-transmitting portion. Such light may be incident to the display device 1 and/or the display panel 100 from outside thereof.

In detail, the display device 1 may include a display area DA, and a light-transmitting portion at which an organic light-emitting diode OLED is not disposed in the display area DA. The light-transmitting portion may be understood as an area in which light/signal emitted from a component or light/signal incident onto the component transmits.

The component may be in the light-transmitting portion. The component may include an electronic element having a function relative to light and/or sound. Such light and sound may be provided from outside or inside the display device 1 and/or the display panel 100. In an embodiment, for example, the component may include a sensor which receives light such as an infrared ray sensor, a sensor which outputs and senses light or sound so as to measure a distance from the display device 1 or the display panel 100 or to recognize a fingerprint thereto, a lamp which outputs light, or a speaker which outputs sound. In the case of the electronic element using light, portions of light having various wavelength bands, such as visible rays, infrared rays, or ultraviolet rays, may be used.

In the present embodiment, the lower conductive layer DM' may reduce or effectively prevent light emitted from the component described above from reaching a pixel P.

Figure 6:
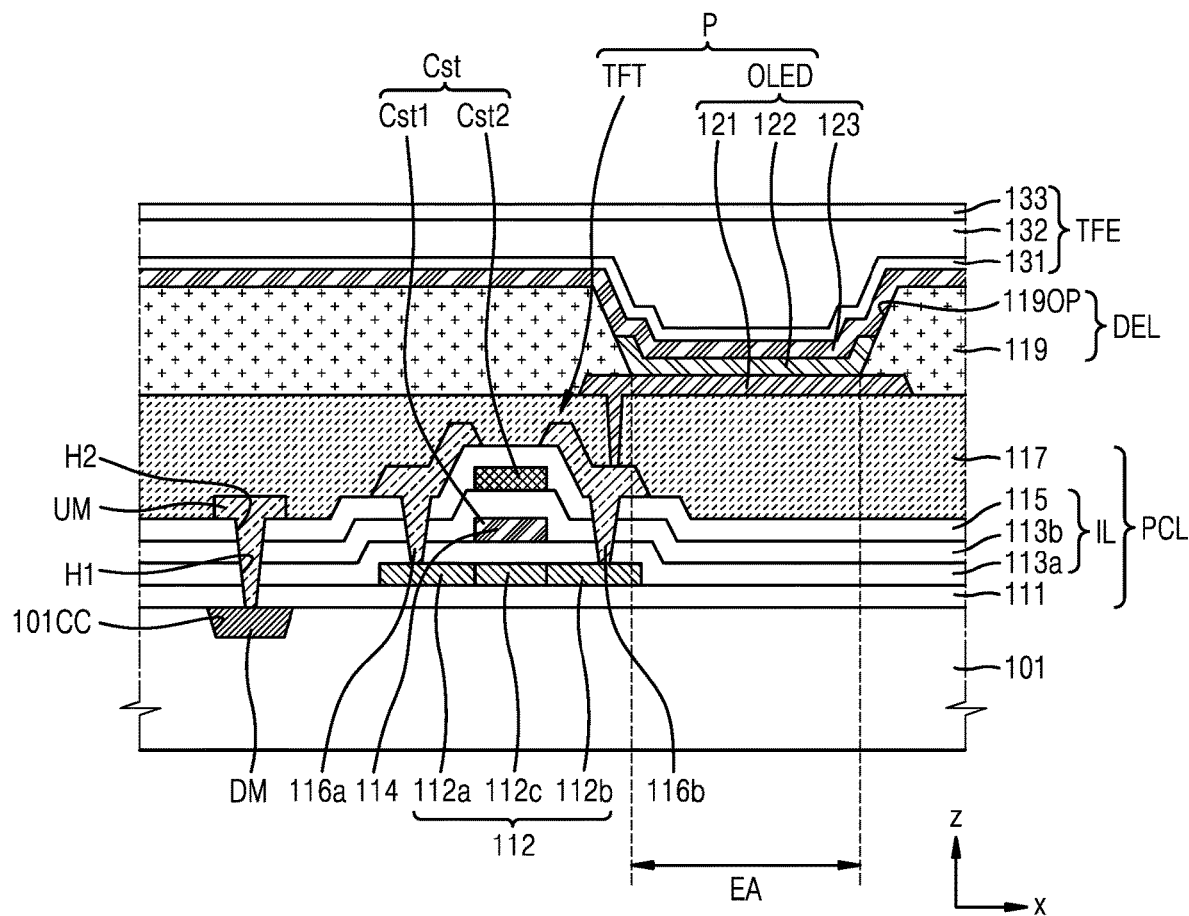
FIG. 6 is an enlarged cross-sectional view of still another embodiment of a pixel of a display device.

FIG. 6 is an enlarged cross-sectional view of still another embodiment of a pixel P of a display device 1. In FIG. 6, the same reference numerals as those of FIG. 3A refer to the same elements, and thus, a redundant description thereof will be omitted.

Referring to FIG. 6, a substrate 101 may include a concave portion 101CC, and a lower conductive layer DM may be in the concave portion 101CC.

The lower conductive layer DM may be directly connected to the upper conductive layer UM. In detail, a first contact hole H1 and a second contact hole H2 may be connected to each other, and the upper conductive layer UM and the lower conductive layer DM may be connected to each other via the first contact hole H1 and the second contact hole H2. That is, the intermediate conductive layer MM (FIGS. 3-5) is omitted such that the lower conductive layer DM is directly connected to the upper conductive layer UM.

The upper conductive layer UM which may function as a driving voltage line PL may be connected to the lower conductive layer DM, and thus, an electrical resistance of the driving voltage line PL may be reduced. Thus, problems of a residual image which may occur due to relatively high electrical resistance may be solved.

Figure 7:
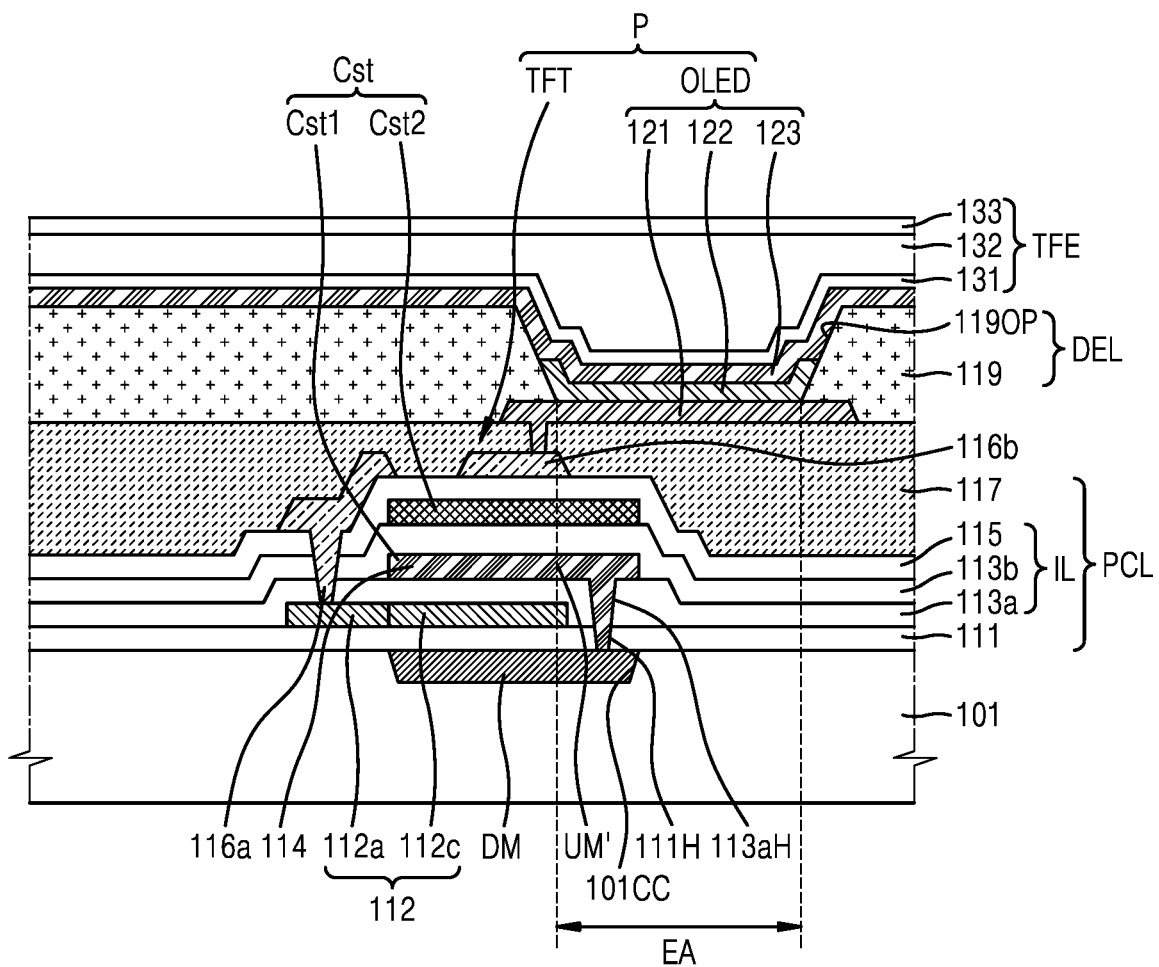
FIG. 7 is an enlarged cross-sectional view of yet another embodiment of a pixel of a display device.

FIG. 7 is an enlarged cross-sectional view of yet another embodiment of a pixel P of a display device 1. In FIG. 7, the same reference numerals as those of FIG. 3A refer to the same elements, and thus, a redundant description thereof will be omitted.

Referring to FIG. 7, a substrate 101 may include a concave portion 101CC, and a lower conductive layer DM may be in the concave portion 101CC.

In the current embodiment, an upper conductive layer UM' may be on a first gate insulating layer 113a, and thus, the upper conductive layer UM' may be provided or formed as a one body with a gate electrode 114 of the thin-film transistor TFT. That is, the upper conductive layer UM' may define or be the gate electrode 114, such that the upper conductive layer UM' is considered as connected to the thin-film transistor TFT. In detail, the upper conductive layer UM' may be provided or formed by the gate electrode 114 extending along the substrate 101 (e.g., in the x-direction and/or the y-direction).

The upper conductive layer UM' may be connected to the lower conductive layer DM. The upper conductive layer UM' may be connected to the lower conductive layer DM via a first gate insulating layer contact hole 113aH and a buffer layer contact hole 111H. In this case, the first gate insulating layer contact hole 113aH may not overlap the semiconductor layer 112 (e.g., may be spaced apart from the semiconductor layer 112 along the x-direction and/or the y-direction). In an embodiment, for example, the first gate insulating layer contact hole 113aH may not overlap the drain area 112a or the channel area 112c.

In another embodiment, the lower conductive layer DM may be connected to the gate electrode 114 via a contact hole defined in a layer between the lower conductive layer DM and the gate electrode 114.

Referring to FIG. 7, the gate electrode 114 may include a first portion which extends along the substrate 101 and is on the semiconductor layer 112 to correspond to a position thereof, and a second portion which is not on the semiconductor layer 112 (e.g., extends further than an end of the semiconductor layer 112). The gate electrode 114 may be connected to the lower conductive layer DM at the first gate insulating layer contact hole 113aH and the buffer layer contact hole 111H. In detail, the second portion of the gate electrode 114 and the lower conductive layer DM may be connected to each other at the first gate insulating layer contact hole 113aH and the buffer layer contact hole 111H.

FIG. 7 is an enlarged cross-sectional view of a pixel P in which the lower conductive layer DM is connected to the gate electrode 114 as a wire. Thus, a source area 112b of the semiconductor layer 112 is omitted, and the source electrode 116b connected to the source area 112b of the semiconductor layer 112 via a contact hole is also omitted. However, this will be fully understood by those skilled in the art.

The arrangement of the lower conductive layer DM connected to the gate electrode 114 described above may be provided to reduce the electrical resistance of the gate electrode 114.

In order to reduce the electrical resistance of the gate electrode 114, a thickness of the gate electrode 114 may be increased. However, there is a limitation in increasing the thickness of the gate electrode 114 in the pixel circuit layer PCL. In an embodiment, for example, when the thickness of the gate electrode 114 in the pixel circuit layer PCL increases, the interlayer insulating layer 115 may not cover an entirety of the gate electrode 114.

Thus, in order to reduce the electrical resistance of the gate electrode 114, the lower conductive layer DM may be in the concave portion 101CC of the substrate 101. Thus, problems of a residual image which may occur due to relatively high electrical resistance of the gate electrode 114 may be solved.

As described above, in one or more embodiments, a substrate including a concave portion is provided, and a conductive material layer is in the concave portion. Thus, a display device having high quality can be provided.

Furthermore, there is no step difference caused by the conductive material layer in the substrate, and thus, a low temperature polysilicon ("LTPS") may be relatively easily manufactured using an ELA process.

It should be understood that embodiments described herein should be considered in a descriptive sense only and not for purposes of limitation. Descriptions of features within each embodiment should typically be considered as available for other similar features in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
    a substrate defining a concave portion recessed from a top surface of the substrate;
    a lower conductive layer in the concave portion;
    an upper conductive layer connected to the lower conductive layer;
    an insulating layer between the lower conductive layer and the upper conductive layer and in which a contact hole is defined, the upper conductive layer connected to the lower conductive layer at the contact hole;
    a thin-film transistor on the substrate and comprising a semiconductor layer and a gate electrode on the semiconductor layer; and
    a display element connected to the thin-film transistor.

2. The display device of claim 1, wherein the insulating layer comprises an interlayer insulating layer between the upper conductive layer and the gate electrode, and in which the contact hole is defined.

3. The display device of claim 2, further comprising, within the contact hole, an intermediate conductive layer which connects the upper conductive layer and the lower conductive layer to each other.

4. The display device of claim 3, wherein
    the insulating layer further comprises a gate insulating layer between the interlayer insulating layer and the gate electrode, and in which a first contact hole portion of the contact hole is defined,
    the interlayer insulating layer defines a second contact hole portion of the contact hole which is connected to the first contact hole portion, and
    at the contact hole,
        the lower conductive layer and the intermediate conductive layer are connected to each other at the first contact hole portion, and
        the upper conductive layer and the intermediate conductive layer are connected to each other at the second contact hole portion.

5. The display device of claim 1, wherein the upper conductive layer defines the gate electrode.

6. The display device of claim 1, wherein the lower conductive layer corresponds to a position of the semiconductor layer of the thin-film transistor.

7. The display device of claim 1, wherein within the contact hole, the upper conductive layer is directly connected to the lower conductive layer.

8. The display device of claim 1, wherein the substrate defining the concave portion comprises:
   a base layer comprising polymer resin, and
   a barrier layer comprising an inorganic material, the barrier layer being closer to the thin-film transistor than the base layer.

9. The display device of claim 8, wherein
   a top surface of the barrier layer defines the top surface of the substrate,
   the concave portion is recessed from the top surface of the barrier layer in a direction toward the base layer, and
   a bottom of the concave portion corresponds to a top surface of the base layer.

10. The display device of claim 8, wherein
    a top surface of the barrier layer defines the top surface of the substrate, and
    the concave portion comprises:
       an opening extended from the top surface of the barrier layer and defined through a thickness of the barrier layer, and
       a recess extended from a top surface of the base layer and connected to the opening.

11. The display device of claim 1, wherein the top surface of the substrate is coplanar with a top surface of the lower conductive layer.

12. The display device of claim 1, wherein the substrate comprises glass.

13. A display device comprising:
    a substrate defining a concave portion recessed from a top surface of the substrate;
    a lower conductive layer in the concave portion;
    an insulating layer on the substrate and in which a contact hole is defined corresponding to the lower conductive layer;
    a thin-film transistor on the substrate and connected to the lower conductive layer which is in the concave portion of the substrate, the thin-film transistor comprising a semiconductor layer and a gate electrode on the semiconductor layer; and
    a display element connected to the thin-film transistor.

14. The display device of claim 13, further comprising an upper conductive layer connected to the thin-film transistor, wherein
    the insulating layer comprises an interlayer insulating layer between the upper conductive layer and the gate electrode, and in which the contact hole is defined, and
    at the contact hole, the upper conductive layer connected to the thin-film transistor is further connected to the lower conductive layer.

15. The display device of claim 14, further comprising, within the contact hole, an intermediate conductive layer which connects the upper conductive layer and the lower conductive layer to each other.

16. The display device of claim 13, wherein at the contact hole, the lower conductive layer is connected to the thin-film transistor at the gate electrode thereof.

17. The display device of claim 13, wherein the lower conductive layer corresponds to a position of the semiconductor layer of the thin-film transistor.

18. The display device of claim 13, wherein the substrate comprises:
    a base layer comprising polymer resin, and
    a barrier layer comprising an inorganic material and defining the top surface of the substrate from which the concave portion is recessed.

19. The display device of claim 13, wherein
    the substrate comprises:
       a base layer comprising polymer resin, and
       a barrier layer comprising an inorganic material, a top surface of the barrier layer defining the top surface of the substrate, and
    the concave portion comprises:
       an opening extended from the top surface of the barrier layer and defined through a thickness of the barrier layer, and
       a recess extended from a top surface of the base layer and connected to the opening.

20. The display device of claim 13, wherein the top surface of the substrate is coplanar with a top surface of the lower conductive layer.

* * * * *